(12) United States Patent
Sekihara

(10) Patent No.: US 9,176,374 B2
(45) Date of Patent: Nov. 3, 2015

(54) PELLICLE

(71) Applicant: SHIN-ETSU CHEMICAL CO., LTD., Tokyo (JP)

(72) Inventor: Kazutoshi Sekihara, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 173 days.

(21) Appl. No.: 14/046,357

(22) Filed: Oct. 4, 2013

(65) Prior Publication Data

US 2014/0106265 A1 Apr. 17, 2014

(30) Foreign Application Priority Data

Oct. 16, 2012 (JP) ................. 2012-228582

(51) Int. Cl.
*G03F 1/62* (2012.01)
*G03F 1/64* (2012.01)
*G03F 1/00* (2012.01)

(52) U.S. Cl.
CPC *G03F 1/64* (2013.01); *G03F 1/142* (2013.01); *Y10T 428/24008* (2015.01)

(58) Field of Classification Search
CPC ..................................... G03F 1/62; G03F 1/64
USPC .................................................. 430/5; 428/14
See application file for complete search history.

(56) References Cited

U.S. PATENT DOCUMENTS 7,264,853 B2 *  9/2007  Eschbach et al. ............. 428/14
2011/0275012 A1 * 11/2011  Horikoshi ......................... 430/5

FOREIGN PATENT DOCUMENTS

JP       2006-056544 A       3/2006

* cited by examiner

*Primary Examiner* — Stephen Rosasco
(74) *Attorney, Agent, or Firm* — Westerman, Hattori, Daniels & Adrian, LLP

(57) ABSTRACT

A pellicle is proposed in which the frame is composed of a detachable double structure of an inner frame and an outer frame, and the pellicle membrane is adhered only to the inner frame and the photomask-agglutination layer is laid only to the inner frame, and the outer frame is removed from the inner frame after the pellicle is agglutinated to the photomask.

5 Claims, 4 Drawing Sheets

PELICLE

The present non-provisional patent application claims priority, as per Paris Convention, from Japanese Patent Application No. 2012-228582 filed on 2012 Oct. 16, the disclosure of which is hereby incorporated by reference herein in its entirety.

FIELD OF THE INVENTION

The present invention relates to a pellicle useful as a dust-fender employed in the scenes of manufacturing semiconductor devices, IC packages, printed circuit boards, liquid crystal display panels, organic EL display panels, etc.

BACKGROUND TECHNOLOGY

In manufacturing semiconductor devices such as LSI and super-LSI or in manufacturing a liquid crystal display panel or the like, a pattern is made by irradiating a ultraviolet light to a semiconductor wafer or a glass plate for liquid crystal, but if a dust particle is sticking to a photomask used in this stage, the particle obstructs the light or refracts it, causing deformation of a transferred pattern, short-circuitry, or the like, and thus this phenomenon leads to lowering of the quality of the end products.

Thus, these works are usually performed in a clean room, but, even in a clean room, it is yet difficult to keep the photomask clean all the time; hence, in practice, the light irradiation is conducted only after a surface of the photomask is sheltered by a pellicle as a dust fender. Under such circumstances, foreign particles do not directly adhere to the surface of the photomask, but only onto the pellicle membrane, and thus by setting a photo focus on a lithography pattern on the photomask, the foreign particles on the pellicle membrane fail to transfer their shadows on the photomask and thus no longer become a problem to the image transfer performance.

In general, a pellicle is built up of a pellicle frame, which is an endless frame bar usually made of aluminum, a stainless steel, or polyethylene, and a transparent pellicle membrane usually made of cellulose nitrate, cellulose acetate or a fluorine-containing polymer which transmit light well; this pellicle membrane is attached via dried solution or adhesive to one of the two annular faces (hereinafter referred to as "upper annular face"). On the other one of the two annular faces of the frame (hereinafter referred to as "lower annular face") is laid an agglutinant layer made of a polybutene resin, a polyvinyl acetate resin, an acrylic resin, a silicone resin or the like for attaching the pellicle frame to the photomask, and over this agglutinant layer is laid a releasable liner (separator) for protecting the agglutinant layer.

In general, a pellicle membrane is a thin film made of a resin, so that in order to fix it on a pellicle frame in a slack and ripple-free manner, it is necessary to stretch the pellicle membrane to an appropriate extent as it is being fixed on the frame. Therefore, in the case of a rectangular pellicle, which is generally the case, the pellicle frame after being coupled with the pellicle membrane tends to curve inwardly to some extent on account of the tension of the pellicle membrane.

This phenomenon is more conspicuous in the case of a large-sized pellicle, used for manufacturing printed circuit boards or liquid crystal display panels, for example, wherein the frame side bars are relatively long, and also in the case of a small-sized pellicle, used for manufacturing semiconductor devices, wherein the frame is made of a material having low rigidity as is required for the reasons of limitations in material kind and size.

On the other hand, the photomask is required to provide as large an area as possible to be exposed to light for higher cost performance. However, the inward sagging of the frame side bars decreases the effective area of the photomask available for light exposure, and, therefore, there have been efforts to minimize the inward sagging of the pellicle frame as much as possible for better economy to thereby meet the market's expectation.

Hence, heretofore, pellicle frames have been proposed so as to solve the problem of the pellicle frame sagging, such as is described in IP Publication 1. This pellicle frame has a pair of opposing frame side bars which are outwardly bulged in a shape of an arc in their middle parts and inwardly bulged in a shape of an arc on either side of the said outward bulging and terminate as a straight line, respectively; when the designing of this configuration is appropriately balanced, the sagging amount would be controlled to be less than a certain threshold value.

LIST OF PRIOR ART PUBLICATIONS

IP Publications

[IP Publication 1]
Japanese Patent Application Publication 2006-56544

BRIEF DESCRIPTION OF THE INVENTION

Problems the Invention Seeks to Solve

However, it has been found that, when efforts were made to narrow the widths of the pellicle side bars of IP Publication 1 as much as possible, the result was always a pellicle frame which cannot stand a practical use.

In other words, although it is expected that whatever the widths of pellicle side bars may be, so long as the designing ensures a balance between the membrane tension and the outward bias of the side bars, straight side bars should always be the result, still the fact remains that when the widths of the pellicle side bars are excessively reduced, even if straight-line side bars are obtained, the rigidity of the pellicle frame is too small so that the deformation of the pellicle frame becomes extraordinary and handling of the frame becomes difficult, and only a slight external force added to the frame could cause slacking or rippling in the pellicle membrane and hence such a pellicle frame cannot be used practically.

Therefore, the present invention was contrived in order to solve the above-mentioned problem, and it is an object of the present invention to provide a pellicle which has a minimized side bar widths to secure an increased light exposure area, and which at the same time experiences no deformation in the frame and no slacking and rippling in the membrane during manufacturing and transportation, and which can be agglutinated to a photomask with a predetermined dimensional precision.

Means to Solve the Problem

The present invention is characteristic in that the pellicle frame has a double structure consisting of an inner frame and an outer frame, that the inner frame is adapted to hold the pellicle membrane in a slack-free manner and also to hold a mask agglutinant layer, and that the outer frame is adapted to closely connect with the inner frame detachably.

The invention is also characteristic in that the inner frame and the outer frame are connected with each other by means of a screw or a magnet.

The invention is furthermore characteristic in that the pellicle is agglutinated to a photomask in a manner such that, during the process of effecting the agglutination of the pellicle to the photomask, only the inner frame of the pellicle frame receives pressure, and that after the agglutination the outer frame is removed and only the inner frame holding the pellicle membrane in a slack-free manner remains on the photomask.

According to the pellicle of the present invention, the outer frame adds rigidity to the frame during the times when a rigidity must be secured high such as during manufacturing or transportation, and after the adhesion of the pellicle to the photomask when the maintenance of the high rigidity is no longer a must, the outer frame is removed whereby a predetermined pellicle outer dimension can be realized.

Effects of the Invention

According to the present invention, it is possible to maximize the light exposure area, which is inside the pellicle frame, on account of the minimization of the widths of the pellicle side bars. Also, in the case of a pellicle which has low rigidity on account of a requirement about the material or dimension, since the rigidity is supplemented by the outer frame it is possible to manufacture it in the same manner as a usual pellicle and it is possible too to transport it in a container without incurring deformation of the pellicle frame or damage or wrinkle to the pellicle membrane. Furthermore, it is possible for the pellicle of the present invention to be adhered to a photomask with a predetermined dimensional precision being maintained.

BRIEF DESCRIPTION OF DRAWINGS

FIG. 5 (b) is a cross section showing a situation after a removal of the outer frame.

EXAMPLES TO EMBODY THE PRESENT INVENTION

Figure 1:
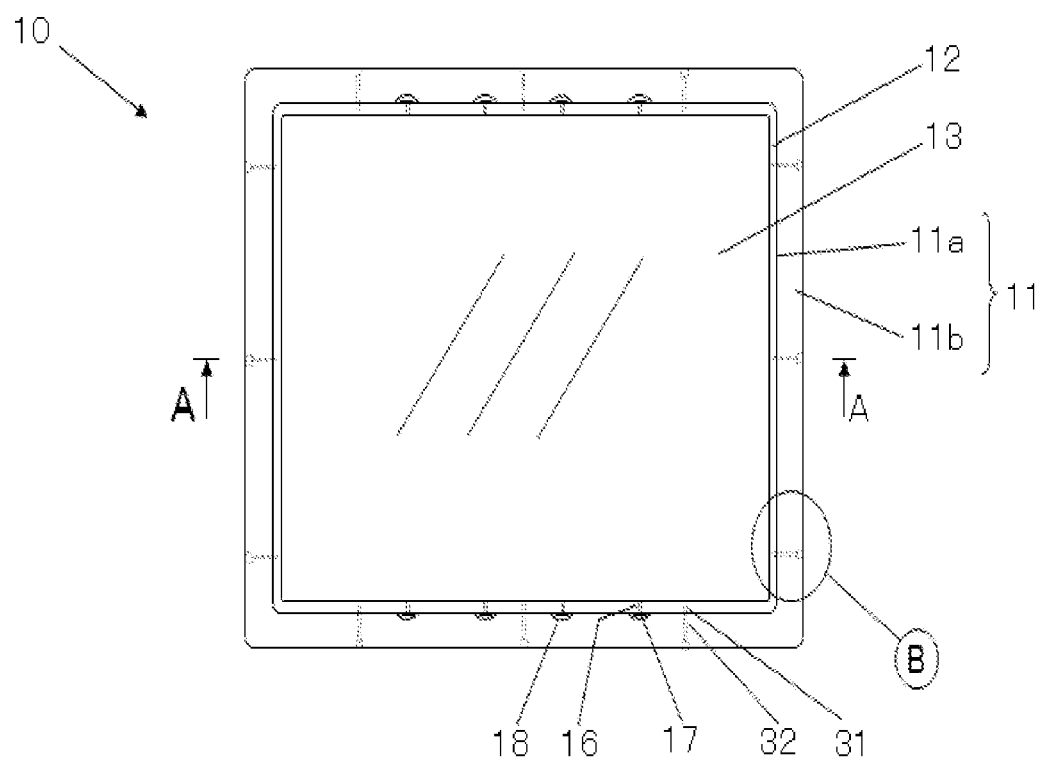
FIG. 1 is a plan view schematically showing a pellicle of the present invention.

We will now explain examples of how the present invention is embodied, using drawings, but the scope of the present invention shall not be construed limited by these examples.

Although the present invention is more beneficial in the case of large-sized pellicles whose side bars exceed 500 mm in length such as ones used for manufacture of liquid crystal display panels, but the applicability of the present invention is not limited by the size of a pellicle. The present invention can be applied to any pellicle which cannot secure enough rigidity against the magnitude of its own size (lengths of the side bars) or tension of the pellicle membrane.

Examples of the present invention are shown in FIGS. 1 through 4. A pellicle frame 11 is made up of an inner frame 11a and an outer frame 11b. On an upper face of the inner frame 11a is laid an adhesive layer 12 for a pellicle membrane 13 to be adhered to the frame. On the opposite face of the inner frame 11a is laid an agglutinant layer 14 for agglutination of the pellicle to a photomask (not shown), and the surface of this agglutinant layer is covered with a protective separator 15, which is removed before the agglutination.

An air vent 16 is formed through the inner frame 11a, and optionally a filter 17 may be provided at outer exit of the vent so as to prevent air from carrying a foreign matter into pellicle's inner space at the time of ventilation. The external dimension of the inner frame 11a is well if it meets the dimension determined on the side of the exposure equipment with respect to a photomask to be applied, but it is preferable that the internal dimension of the inner frame 11a is made as large as possible—in other words the widths of the side bars of the inner frame 11a may as well be made as thin as possible. The side bar widths need be large enough to sustain the precision with which the inner frame 11a is finished and at the same time to maintain the adhesive strength with which the pellicle membrane is adhered. While it depends on the material and side bar lengths of the inner frame 11a, the side bar widths are preferably 1.5-10 mm, and it may differ between the long side bars and short side bars.

In the case of a normal pellicle frame, its bar widths must be determined after giving considerations to the amount of sagging expected to occur on account of the tension of the pellicle membrane, but in the case of the pellicle frame of the present invention, even if the rigidity of the inner frame 11a, which tensely supports the pellicle membrane, is low, the outer frame 11b supplements the rigidity so as to enable the frame to withstand the manufacturing process. Then, after the pellicle is agglutinated to the photomask, the inner frame 11a is fixed on the photomask so strongly that no deformation of the frame is caused by the tension of the pellicle membrane 13. Hence, the width of the inner frame 11a may be designed as thin as possible without giving a consideration to the sagging caused by the tension of the pellicle membrane 13.

The inner frame 11a may be made of a light alloy such as aluminum alloy, or a ferrous material such as carbon steel and stainless steel, or an engineering resin such as PPS and PEEK or any of these resins added with a reinforcing material, or a fiber-reinforced resin, or any of other conventional pellicle frame materials. It is preferable if a suitable blackening treatment is applied to the surface of the inner frame from the viewpoints of dust generation prevention, preservation of light resistance, and easiness in inspection of foreign materials.

The outer frame 11b is adapted to fit by its inside wall to the outside wall of the inner frame 11a such that engagement with and disengagement from the inner frame 11a is effected smoothly, and the clearance between the outer frame 11b and the inner frame 11a is preferably in a range of 30 to 200 micrometers at each frame side bar. The external dimension of the outer frame 11b needs be designed with a consideration such that a sufficient rigidity is secured. In particular, it is necessary to design with a result that the outer frame coupled with the inner frame 11a does not undergo bending or twisting even when subjected to handling operation.

It is also preferable that the upper face and the lower face of the outer frame 11b are respectively flush with the upper face and the lower face of the inner frame 11a. If not flush, it is feared that the unevenness would interfere during the manufacture of the pellicle or its agglutination to the photomask. Also, since a filter 17 is provided in the outer surface of the inner frame 11a, it is preferable that a hollow 18 is made so as to prevent interference between the filter and the outer frame 11b. Furthermore, it is preferable too to provide a hole, a groove or a step (not shown) in the outside wall of the outer frame for the convenience of handling.

Like the inner frame 11a, the outer frame 11b may be made of a light alloy such as aluminum alloy, or a ferrous material such as carbon steel and stainless steel, or an engineering resin such as PPS and PEEK or any of these resins added with a reinforcing material, or a fiber-reinforced resin, or any of other conventional pellicle frame materials. Also, it is preferable if a suitable blackening treatment is applied to the surface of the outer frame.

Figure 3:
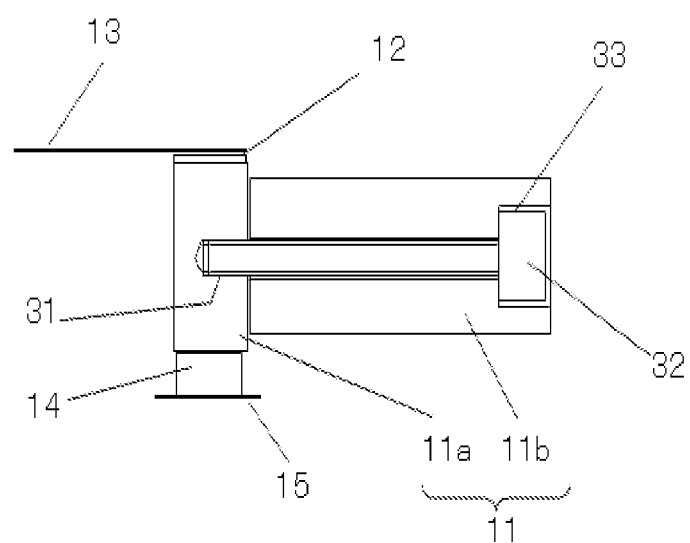
FIG. 3 is an enlarged cross section taken from the position B in FIG. 1 and shows how a screw is used to effect connection between an inner frame and an outer frame.

FIG. 3 shows how the inner frame 11a and the outer frame 11b are combined by means of a screw. The inner frame 11a and the outer frame 11b are fixed together as a bolt 32 is screwed to a female screw 31, which is formed from the outside wall of the outer frame 11b and extends into the inner frame 11a. The entirety of the head part of the bolt 32 is preferably received in a counter-bore so that it does not protrude beyond the outside wall of the outer frame 11b. Also, the number and the positioning of the screwing are preferably determined based on the size of the pellicle, but it is important that they are such that the deformation of the pellicle frame caused by the tension of the pellicle membrane is not distinct.

Figure 4:
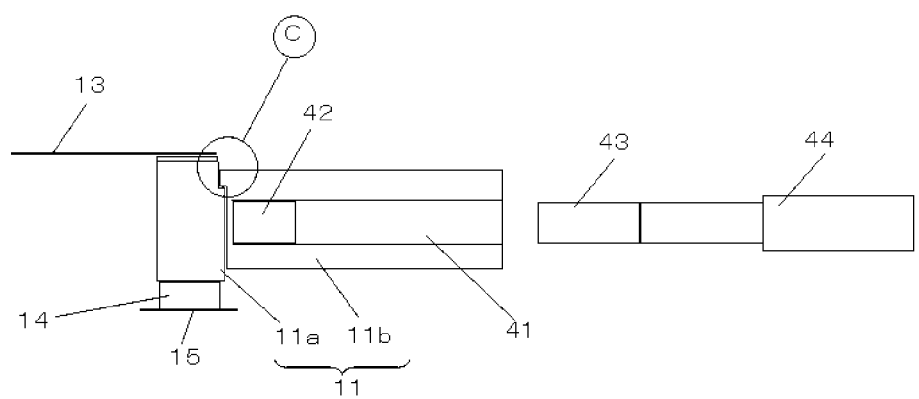
FIG. 4 is another enlarged cross section taken from the position B in FIG. 1 and shows how a magnet piece is used to effect connection between an inner frame and an outer frame.

FIG. 4 shows how the inner frame and the outer frame are fixed together with magnet. In this embodiment, the inner frame 11a is made of a magnetic material such as carbon steel, and the outer frame 11b is made of a non-magnetic material such as aluminum alloy. The fixation is effected as a permanent magnet 42 is inserted in a cavity 41 formed in the outer frame 11b whereby the inner frame 11a is attracted by the magnet 42. The permanent magnet 42 is not pasted in the cavity 41 so that it can be inserted in and removed from the cavity 41. It is preferable if the permanent magnet 42 is small-sized but has a strong magnetic force, and most preferably it is a rare-earth magnet such as samarium cobalt magnet and neodymium magnet. The separation of the outer frame 11b from the inner frame 11a, which is done after the pellicle is adhered to the photomask, is effected by inserting a retrieval tool 44 having a permanent magnet 43 at its head, which has a greater magnetic force than the magnet 42, into the cavity 41 whereupon the magnet 42 is caught by the magnet 43 and thus carried away from the cavity 41 so that two frames 11a and 11b become freely separable.

In the case where magnetic force is used to effect the frame fixation, it is not easy to fix together the inner and the outer frames at a desired position precisely; to overcome this it is preferable to provide an engagement step to each of the inner frame 11a and the outer frame 11b so as to assist the precise positioning of them, such as the ones shown at C in FIG. 4. Also, in the case of magnetic fixation, the structure is more complicated than in the case of the screw fixation shown FIG. 3, but its advantages include that it is easier to separate the frames after the pellicle is adhered to the photomask and that since a screw is not used the amount of foreign particles generated during the fixation and disengagement steps is substantially smaller.

The inner frame 11a and the outer frame 11b are fixed together at a first stage of a pellicle manufacturing process, and thereafter it is preferable that the thus assembled frames 11a and 11b are treated as if it were one monolithic body of pellicle frame 11, but cleaning of the inner frame 11a and the outer frame 11b is preferably conducted separately so as to secure high cleanliness. Also, it is preferable that the filter 17 is set on the inner frame 11a at a step prior to the fixation of the outer frame 11b. The other work steps can be conducted in the same manner as in the case of a conventional pellicle, and after the completion, the pellicle can be positioned in a pellicle container in a commonly known procedure and transported.

A difference from the manufacture of a conventional pellicle lies in that the adhesive layer 12 for pellicle membrane and the agglutinant layer 14 for photomask are provided only on the inner frame 11a. As the role of the outer frame 11b is to secure high rigidity of the entire frame required of a pellicle frame and to provide a grip for handling of the pellicle during the manufacturing process, the adhesive layer 12 and the agglutinant layer 14 are not laid on the outer frame 11b.

Figure 5:
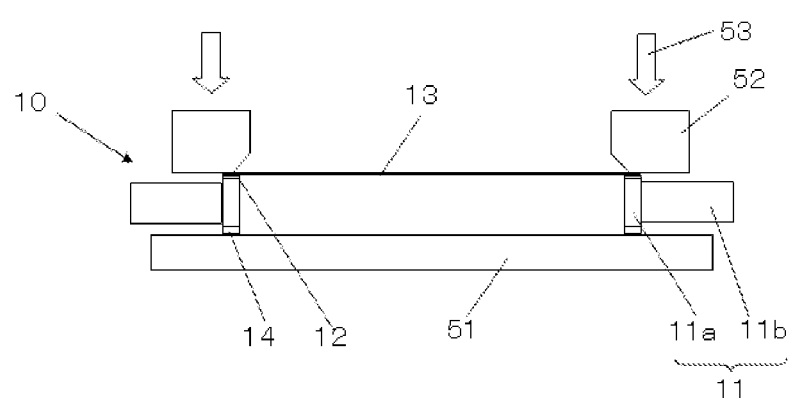
FIG. 5 (a) is a cross section showing how a pellicle of the present invention is agglutinated to a photomask.
Figure 5:
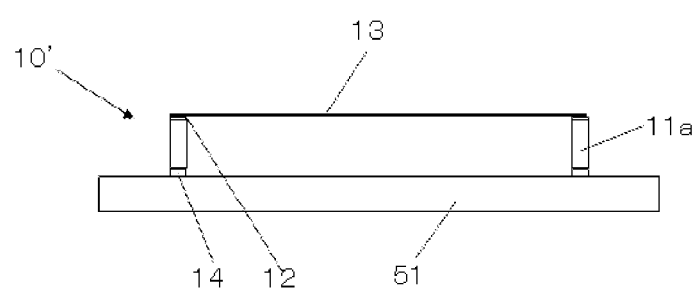

FIG. 5 (a) shows a cross section illustrating a pellicle 10 being agglutinated to a photomask 51. In order to effect the agglutination, the pellicle 10 is first positioned at a predetermined location on the photomask 51, and the frame 11, preferably only the inner frame 11a, is pressed, by its upper face, by a press plate 52 in a direction shown by arrows 53, and by virtue of this kind of procedure, it is possible to avoid an effect of the outer frame 11b. Then, after the agglutination, the outer frame 11b is separated and removed from the inner frame 11a in the above-described manner, and hence the pellicle 10' having only the inner frame 11a is left on the photomask 51, as shown in FIG. 5 (b).

By virtue of the above-described construction, the pellicle frame 11 maintains the required rigidity thanks to the outer frame 11b throughout the manufacturing and transportation steps so that there is no need now for the inner frame 11a to secure such rigidity on its own. In other words, the rigidity of the pellicle frame (inner frame 11a) suffices if the frame can sustain the pellicle membrane 13 without sagging after the frame is agglutinated on the photomask 51.

On account of this, it is now possible to design the width of the pellicle frame to a smaller value, and it is also possible to select from a wider variety of materials. As a result, it becomes possible to make a large-sized pellicle in which the width of the pellicle frame is smaller than conventional, so that a benefit is that it is possible to secure a larger exposure area. Also, besides large-sized pellicles, the invention is applicable to small-sized pellicles too which are used to make semiconductor devices, since it enables use of a pellicle frame whose rigidity is extremely reduced so as to prevent deformation of the photomask.

EXAMPLES

We will now explain examples of the present invention, but the scope of the invention shall not be construed limited by these examples.

Example 1

Figure 2:
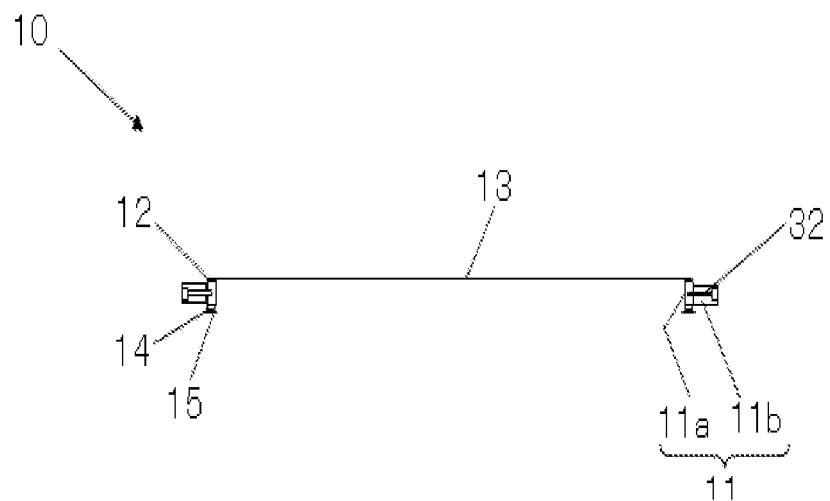
FIG. 2 is a cross section as cut by a plane indicated by A and A in FIG. 1.

An inner frame 11a made of an aluminum alloy and having an external dimension of 474 mm×782 mm, an internal dimension of 466 mm×774 mm and a height of 4.9 mm was made by machining and was used to make up a pellicle frame 11 shown in FIGS. 1, 2 and 3, and the surface of the frame 11a was blackened by alumite treatment. Also the outside wall of the inner frame 11a was formed with a non-penetrating female screw 31 and an air vent 16 at positions shown in FIG. 1.

An outer frame 11b made of an aluminum alloy and having an external dimension of 514 mm×822 mm, an internal dimension of 474 mm×782 mm and a height of 4.0 mm was made by machining, and its surface was blackened by alumite treatment. On this occasion, the dimensional tolerance between the external dimension of the inner frame 11a and the internal dimension of the outer frame 11b at each side bar was set to 0.05-0.1 mm. A counter-bore 33 was made to receive a bolt head in the outer frame 11b at a location corresponding to each female screw of the inner frame 11a; similarly a hollow 18 was made in the outer frame 11b in the vicinity of each air vent 16 so as to avoid an interference between the filter 17 and the outer frame 11b.

The inner frame 11a and the outer frame 11b, prepared as described above, were brought into a clean room, wherein they were washed with a surfactant and pure water and dried completely. First, the inner frame 11a was inspected for foreign material, and the filter 17 was set in the air vent 16, and the inner frame 11a was fitted inside the outer frame 11b, and was fixed thus by bolt 32 whereby a pellicle frame 11 was manufactured.

A silicone adhesive KR3700 (a product name, manufactured by Shin-Etsu Chemical Co., Ltd.) was applied by an air pressurization type dispenser to the upper annular face of the inner frame 11a of this pellicle frame 11 to make the adhesive layer 12, and also to the lower annular face of the inner frame 11a to make the agglutinant layer 14, and these layers were cured by heating. The thickness of the adhesive layer 12 was 0.1 mm and that of the agglutinant layer 14 was 1.3 mm. Next, a protective separator 15, which was cut from a 125-micrometer-thick PET film coated on one side with a parting agent into a dimension nearly congruent to the lower annular face of the inner frame 11a, was put over the agglutinant layer 14.

Apart from the above-described pellicle frame 11, a solution of fluorine-containing polymer CYTOP (a product name, manufactured by Asahi Glass Co. Ltd.) was applied to a flat surface of a rectangular quartz plate measuring 850 mm×1200 mm×10 mm (thickness) by slit coating; then, the solvent of the polymer solution was let to evaporate whereby a membrane was obtained; then, an annular face of a rectangular temporary frame of an aluminum alloy having a similar shape as the rectangular quartz plate was bonded to the membrane formed over the quartz plate by adhesive; after this, the temporary frame was removed from the quartz plate together with the membrane, which had a thickness of about 3 micrometers. This membrane was adjusted to keep an appropriate tension, and was thus brought to adhere to the upper annular face of the inner frame 11a via the adhesive layer 12; then by cutting off the surplus portions of the membrane, which were extending beyond the outer edges of the inner frame 11b, with a cutter, a pellicle 10 was completed.

This pellicle 10 was encased in a pellicle container (not shown), and was transported on a truck through a distance of about 1,000 kilometers for testing. When the pellicle 10 was inspected after the transportation, there was found no sticking of a foreign material, no damage to the pellicle membrane and no abnormality in the connection of the inner frame 11a to the outer frame 11b.

Next, this pellicle 10 was agglutinated to a clean photomask board, which measured 520 mm×800 mm. This agglutination was effected using a pressure plate 52, which is adapted to press only at the upper annular face of the inner frame 11a, as shown in FIG. 5 (a), and the load was 100 kgf.

Thereafter, the bolt 32 was removed and the outer frame 11b was taken away from the inner frame 11a, whereby the pellicle 10', of which the frame consists only of the inner frame 11a, is left on the photomask 51. On this occasion, the pellicle membrane was inspected and no defects such as slack was observed and no foreign matter was observed on that surface of the photomask 51 which was within the pellicle 10'. There was observed no detachment or uneven squash in the agglutinant layer 14. When the position of the pellicle 10' agglutinated on the photomask was measured, the desired dimensional precision was found to be achieved, and no deformation of the pellicle frame (inner frame 11a) was observed.

Example 2

An inner frame 11a made of a carbon steel and having an external dimension of 904.5 mm×750 mm, an internal dimension of 896.5 mm×742 mm and a height of 5.8 mm was made by machining and was used to make up a pellicle frame 11 shown in FIG. 1, and the surface of the frame 11a was subjected to a black chrome plating treatment. Also the outside wall of the inner frame 11a was formed with a non-penetrating female screw 31 and an air vent 16 at positions shown in FIG. 1.

Also, an outer frame 11b made of an aluminum alloy and having an external dimension of 924.5 mm×790 mm, an internal dimension of 904.5 mm×750 mm and a height of 5.0 mm was made by machining, and its surface was blackened by alumite treatment. On this occasion, the dimensional tolerance between the external dimension of the inner frame 11a and the internal dimension of the outer frame 11b at each side bar was set to 0.05-0.1 mm. A counter-bore 33 was made to receive a bolt head in the outer frame 11b at a location corresponding to each female screw of the inner frame 11a; similarly a hollow 18 was made in the outer frame 11b in the vicinity of each air vent 16 so as to avoid an interference between the filter 17 and the outer frame 11b.

A pellicle was constructed using the thus prepared inner and outer frames 11a, 11b in a manner exactly the same as in Example 1, and its performance until it was agglutinated to the photomask was examined, and the result was that it had no problem as a pellicle.

Comparative Example

A pellicle frame having the same dimension and the same shape as the inner frame 11a of Example 1 was made by machining, and a pellicle was made in exactly the same manner as in Example 1 except that no outer frame 11b was added to the inner frame 11a. The thus made pellicle was examined and it was found that a longer side bar sagged by about 3.5 mm and a shorter side bar sagged by about 2 mm. When this pellicle was grasped by its frame for transportation, the pellicle membrane was found to slack or ripple in response to each grasping, so that this pellicle was rated to fail in practical use.

REPRESENTATION OF REFERENCE NUMERALS

10: pellicle
10': pellicle (after removal of outer frame 11b)
11: pellicle frame
11a: inner frame
11b: outer frame
12: adhesive layer for pellicle membrane
13: pellicle membrane
14: agglutinant layer for photomask
15: separator
16: air vent
17: filter
18: hollow
31: female screw
32: bolt
33: counter-bore
41: cavity 42: permanent magnet
43: permanent magnet
44: retrieval tool
51: photomask
52: pressure plate Scopes of what is claimed:

1. A pellicle comprising:
    a pellicle frame having an upper annular face and a lower annular face,
    a membrane adhered in a slack-free manner to said upper annular face of the pellicle frame, and
    an agglutinant layer attached to the lower annular face of the pellicle frame,
    wherein said frame has a double structure consisting of an inner frame and an outer frame, that said membrane is adhered exclusively to said inner frame and said agglutinant layer is attached exclusively to said inner frame, and that the outer frame is adapted to closely connect with the inner frame detachably.

2. The pellicle as claimed in claim 1, wherein said outer frame connects with the inner frame by means of a screw means.

3. The pellicle as claimed in claim 1, wherein said outer frame connects with the inner frame by means of a magnetic means.

4. A method for forming a pattern, comprising agglutinating a pellicle to a photomask using a pressure means, wherein said pellicle comprises a pellicle frame having an upper annular face and a lower annular face, a membrane adhered in a slack-free manner to said upper annular face of the pellicle frame, and an agglutinant layer attached to lower annular face of the pellicle frame, said frame having a double structure consisting of an inner frame and an outer frame, said membrane being adhered exclusively to said inner frame and said agglutinant layer being attached exclusively to said inner frame, and the outer frame being adapted to closely connect with the inner frame detachably, wherein said agglutinating of the pellicle is effected by pressing only said inner frame with said pressure means.

5. The method as claimed in claim 4, wherein after the agglutination the outer frame is detached from said inner frame and only the inner frame holding the pellicle membrane remains on the photomask.

\* \* \* \* \*